United States Patent [19]
Sakurai et al.

[11] Patent Number: 6,040,744
[45] Date of Patent: Mar. 21, 2000

[54] TEMPERATURE-COMPENSATED CRYSTAL OSCILLATOR

[75] Inventors: Yasuhiro Sakurai; Hiroyuki Fukayama, both of Tokorozawa, Japan

[73] Assignee: Citizen Watch Co., Ltd., Tokyo, Japan

[21] Appl. No.: 09/111,800

[22] Filed: Jul. 8, 1998

[30] Foreign Application Priority Data

Jul. 10, 1997 [JP] Japan ................................. 9-185309

[51] Int. Cl.$^7$ ........................................................ H03L 1/02
[52] U.S. Cl. ............................ 331/176; 331/158; 331/66; 331/177 V
[58] Field of Search ............................ 331/177 V, 176, 331/158, 66

[56] References Cited

U.S. PATENT DOCUMENTS 4,412,188  10/1983  Helle et al. ............................... 331/176
4,851,792  7/1989  Ochiai et al. ............................. 331/176

*Primary Examiner*—Arnold Kinkead
*Attorney, Agent, or Firm*—Armstrong, Westerman, Hattori, McLeland, & Naughton

[57] ABSTRACT

In a temperature-compensated crystal oscillator, a series connection of an AT-cut crystal resonator, a MOS capacitor, and a first fixed capacitor is coupled in parallel with an amplifier and a second fixed capacitor, making up a crystal oscillation circuit. A first control signal generating circuit for temperature compensation is connected directly or via a first input resistor to one terminal of the MOS capacitor of the crystal oscillation circuit, and a second control signal generating circuit for temperature compensation is connected dirty or via a second input resistor to the other terminal of the MOS capacitor. The first control signal generating circuit serves as a rectilinear correction signal generating circuit on the lower temperature side while the second control signal generating circuit serves as a rectilinear correction signal generating circuit on the higher temperature side.

18 Claims, 12 Drawing Sheets

TEMPERATURE-COMPENSATED CRYSTAL OSCILLATOR

BACKGROUND OF THE INVENTION

1. Field of the Invention

The present invention relates to a temperature-compensated crystal oscillator mounted in communications equipment such as a cellular phone, and the like.

2. Description of the Related Art

A temperature-compensated crystal oscillator mounted in communications equipment comprises a crystal oscillation circuit incorporating an AT-cut crystal resonator (unit) in a frequency band of 10 MHz as the oscillation source thereof, and a temperature compensation circuit using a frequency adjustment circuit for adjusting an oscillation frequency of the crystal oscillation circuit so as to stabilize the oscillation frequency by canceling out the cubic curve temperature characteristic of the AT-cut crystal resonator.

Among such temperature-compensated crystal oscillators, a direct-compensation type analog temperature-compensated crystal oscillator made up of discrete components has been in the mainstream up to now.

However, in light of a recent trend of increasingly adopting the CDMA (code division multiple access) system aiming at international sharing of a common communications system, an indirect type temperature-compensated crystal oscillator capable of expanding the range of temperature compensation has attracted much attention.

With the indirect type temperature-compensated crystal oscillator, a temperature compensation signal is generated by use of some type of circuit, and temperature compensation for the AT-cut crystal resonator is achieved by controlling a variable capacitance circuit, and the like, with the signal.

As a circuit for generating the temperature compensation signal, a resistor circuit network, made up of discrete components, was used in the past, but a semiconductor IC has recently come into use in many cases.

Since the temperature compensation signal is generated mostly as a voltage signal, a variable capacitance circuit of a voltage control type is often used in the frequency adjustment circuit There has been a shift in the. driving voltage of the temperature-compensated crystal oscillator mounted in the cellular phone from 5 V to 3 V, and further reduction in the voltage is called for.

Consequently, a voltage range of a signal impressed on the variable capacitance circuit has gradually become less.

Accordingly, with the indirect type temperature-compensated crystal oscillator, a variable capacitance circuit having a large capacitance variation ratio in a narrow voltage range is in demand in order to expand the range for temperature compensation.

Also, a system has since been proposed whereby the temperature compensation signal and an external frequency control signal are synthesized into a composite signal for controlling the variable capacitance circuit so as to eliminate mutual interference between temperature compensation and external frequency control for controlling the oscillation frequency by an external signal.

Such a proposal, however, is based on the premise that the variable capacitance circuit has a large capacitance variation ratio such that the oscillation frequency of the crystal oscillation circuit can be varied steeply with a small change in voltage.

Hence, in the indirect type temperature-compensated crystal oscillator, the variable capacitance circuit, in particular, is an important building block thereof.

The variable capacitance circuit comprises at least one variable capacitance element An example of a conventional variable capacitance circuit is shown in FIG. 16.

In the conventional variable capacitance circuit, a fixed capacitor 45 serving as a DC cutoff capacitor and a variable capacitance element 49 are coupled in series, and the other terminal of the variable capacitance element 49 is grounded, while the other terminal 46 of the fixed capacitor 45, as the output terminal thereof, is coupled to the crystal oscillation circuit. An input resistor 47 is connected to a node between the fixed capacitor 45 and the variable capacitance element 49. A control signal A is applied to the node via the input resistor 47.

The input resistor 47 has the function of blocking AC signals, and may be dispensed with provided that a circuit for generating the control signal has a sufficiently high output impedance. The other terminal of the variable capacitance element 49 may sometimes be coupled to a power source (Vcc) on the higher potential side.

A variable capacitance diode, MOS capacitor, and the like are typical of the variable capacitance element 49.

In either of the variable capacitance diode or MOS capacitor, advantage is taken of a phenomenon in which the width of the depletion layer of a semiconductor changes according to voltage, and some ingenious ideas have been devised for application in the manufacturing stage thereof in order to increase the capacitance variation ratio.

In the case of the variable capacitance diode, a type of pn junction diode, an attempt has been made to provide the impurity concentration profile on the side towards which the depletion layer is widened, that is, on the lightly doped side, with a gradient, or to lower the impurity concentration.

Also, in the case of the MOS capacitor, an attempt has been made to lower the impurity concentration in the semiconductor substrate thereof, or to render the thickness of the gate oxide film thinner.

However, since lowering of the impurity concentration in a semiconductor has its limitations, the minimum capacitance value of the variable capacitance cannot be reduced to a great extent, and moreover, there will arise a problem that if an attempt is made to reduce the minimum capacitance value by lowering the impurity concentration, the maximum capacitance value in the range of application voltages also becomes smaller.

Further, in the case of the MOS capacitor, there is a problem in that the maximum capacitance value in the range of application voltages cannot be increased to a great extent even if the maximum physical capacitance value is increased by rendering the thickness of the gate oxide film thinner.

After all, in spite of all the attempts tried at the stage of manufacturing the variable capacitance element up to now, the capacitance variation ratio could not be increased satisfactorily in the range of application voltages.

SUMMARY OF THE INVENTION

It is therefore an object of the invention to provide at low cost a temperature-compensated crystal oscillator having a wide range of frequency adjustment in the range of application voltages, and capable of simplifying a circuit for generating control signals for temperature compensation, and widening the range of temperature compensation even within the narrow voltage range of the control signals by solving the aforesaid problems.

To this end, the temperature-compensated crystal oscillator according to the invention comprises a crystal oscillation circuit provided with an AT-cut crystal resonator and a MOS capacitor for providing a variable capacitance for adjustment of an oscillation frequency, a first control signal generating circuit for temperature compensation, connected directly or via a first input resistor to one terminal of the MOS capacitor, and a second control signal generating circuit for temperature compensation, connected directly or via a second input resistor to another terminal of the MOS capacitor.

The crystal oscillation circuit may have various circuit configurations as described hereinafter:

The circuit configuration comprises a series connection of the AT-cut crystal resonator, the MOS capacitor, and a first fixed capacitor; an amplifier connected in parallel with the series connection; and, a second fixed capacitor coupled in parallel with the amplifier.

The circuit configuration may also comprise a series connection of the AT-cut crystal resonator, the MOS capacitor, and a first fixed capacitor; an amplifier connected in parallel with the series connection; and, a second fixed capacitor and a third fixed capacitor extending between an optional constant potential source and the input terminal and output terminal of the amplifier, respectively.

The circuit configuration may additionally comprise a series connection of the AT-cut crystal resonator, the MOS capacitor, and a first fixed capacitor; an amplifier connected in parallel with the series connection; and, a second fixed capacitor coupled in parallel with the series connection of the AT-cut crystal resonator and the MOS capacitor.

The circuit configuration may further comprise a series connection of the AT-cut crystal resonator, the MOS capacitor, and a first fixed capacitor; an amplifier connected in parallel with the series connection; a second fixed capacitor extending between an optional constant potential source and a node between the amplifier and the AT-cut crystal resonator; and, a third fixed capacitor extending between an optional constant potential source and a node between the MOS capacitor and the first fixed capacitor.

The circuit configuration may moreover comprise a series connection of a first fixed capacitor, the MOS capacitor, and a second fixed capacitor; an amplifier connected in parallel with the series connection; and the AT-cut crystal resonator connected in parallel with the amplifier.

The circuit configuration could also comprise a series connection of a first fixed capacitor, the MOS capacitor, and a second fixed capacitor; an amplifier connected in parallel with the series connection; and, the AT-cut crystal resonator coupled in parallel with the MOS capacitor.

The circuit configuration could additionally comprise a parallel connection of the AT-cut crystal resonator and an amplifier, and a series connection of a first fixed capacitor, the MOS capacitor, and a second fixed capacitor; the series connection extending between one terminal of the AT-cut crystal resonator and an optional constant potential source.

In the temperature-compensated crystal oscillator according to the invention, the crystal oscillation circuit may also comprise a parallel connection of an AT-cut crystal resonator and an amplifier; a series connection of a first fixed capacitor, a first MOS capacitor, a second MOS capacitor, and a second fixed capacitor, coupled in parallel with the AT-cut crystal resonator; and, a third fixed capacitor extending between an optional constant potential source and a node between the first MOS capacitor and the second MOS capacitor.

Otherwise, the crystal oscillation circuit may comprise a series connection of a first fixed capacitor, an AT-cut crystal resonator and a second fixed capacitor; an amplifier connected in parallel with the series connection; a series connection of a first MOS capacitor and a second MOS capacitor, connected in parallel with the AT-cut crystal resonator, and a third fixed capacitor extending between an optional constant potential source and a node between the first MOS capacitor and the second MOS capacitor.

When the crystal oscillation circuit is made up as described above, a first control signal generating circuit for temperature compensation is connected directly or via a first input resistor to a node between the first fixed capacitor and the first MOS capacitor, a second input resistor is extended between the first control signal generating circuit and a node between the second fixed capacitor and the second MOS capacitor, and a second control signal generating circuit for temperature compensation is connected directly or via a third input resistor to a node between the first MOS capacitor and the second MOS capacitor.

Otherwise, a first control signal generating circuit for temperature compensation may be connected directly or via a first input resistor to a node between the first fixed capacitor and the first MOS capacitor, a second control signal generating circuit for temperature compensation may be connected directly or via a second input resistor to a node between the second fixed capacitor and the second MOS capacitor, and further, a third control signal generating circuit for temperature compensation may be connected directly or via a third input resistor to a node between the first MOS capacitor and the second MOS capacitor.

In the respective temperature-compensated crystal oscillators described above, the first control signal generating circuit may be used as a rectilinear correction signal generating circuit on the lower temperature side for generating a signal for linearly correcting the temperature characteristic curve of the AT-cut crystal resonator on the lower temperature side, while the second control signal generating circuit may be used as a rectilinear correction signal generating circuit on the higher temperature side for generating a signal for linearly correcting the temperature characteristic curve of the AT-cut crystal resonator on the higher temperature side.

Further, the rectilinear correction signal generating circuit on the lower temperature side may comprise a temperature sensor with an output having a substantially linear temperature characteristic, and a square-law converter circuit on the lower temperature side for converting the output of the temperature sensor into a square-law curve signal on the lower temperature side, while the rectilinear correction signal generating circuit on the higher temperature side may comprise a temperature sensor with an output having a substantially linear temperature characteristic, and a square-law converter circuit on the higher temperature side for converting the output of the temperature sensor into a square-law curve signal on the higher temperature side.

The above and other objects, features, and advantages of the invention will be apparent from the following detailed description which is to be read in conjunction with the accompanying drawings.

DETAILED DESCRIPTION OF THE PREFERRED EMBODIMENTS

Various embodinents of a temperature-compensated crystal oscillator according to the invention are described hereinafter with reference to the accompanying drawings.
First Embodiment: FIGS. 1 to 4

A first embodiment of the invention is firstly described with reference to FIGS. 1 to 4.

Figure 1:
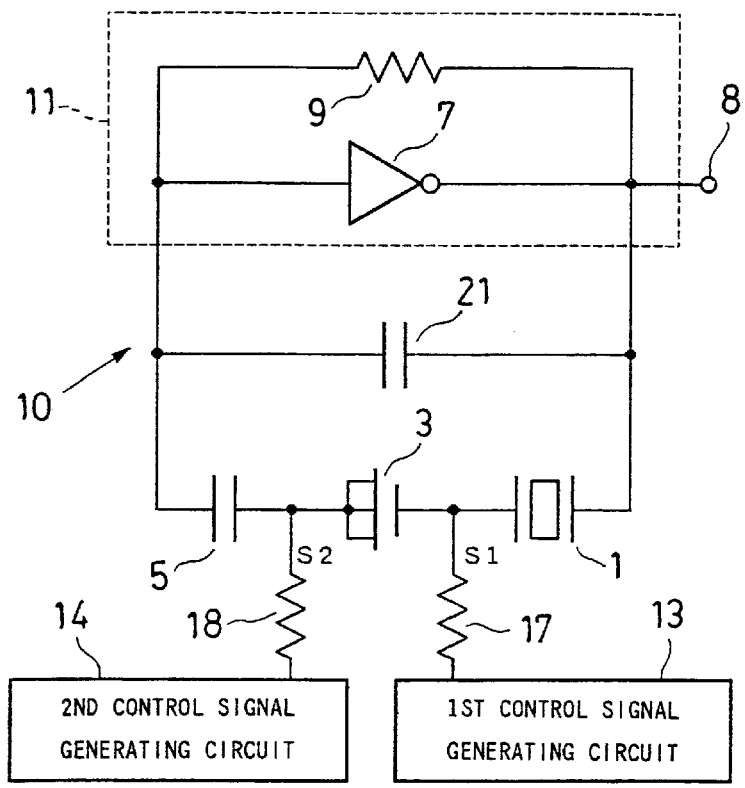
FIG. 1 is a block circuit diagram showing the configuration of a first embodiment of a temperature-compensated crystal oscillator according to the invention.

As shown in FIG. 1, in a temperature-compensated crystal oscillator according to the first embodiment, an AT-cut crystal resonator 1, a MOS capacitor 3, and a first fixed capacitor 5 are coupled in series. This series connection is connected in parallel with an amplifier 11 made up of an oscillating inverter 7 and a feedback resistor 9, connected in parallel, constituting a crystal oscillation circuit 10, having its output terminal at reference 8.

A first control signal generating circuit 13 for temperature compensation is connected via a first input resistor 17 to a node between the AT-cut crystal resonator 1 and the MOS capacitor 3, of the crystal oscillation circuit 10, while a second control signal generating circuit 14 for temperature compensation is connected via a second input resistor 18 to a node between the MOS capacitor 3 and the first fixed capacitor 5. A second fixed capacitor 21 is coupled in parallel with the amplifier 11.

The first input resistor 17 and second input resistor 18 have the function of transmitting DC signals and blocking AC signal. If the output impedance of the first control signal generating circuit 13 and the second control signal generating circuit 14, respectively, is sufficiently high, the first input resistor 17 and second input resistor 18 may be dispensed with, and a control signal for temperature compensation outputted by the first control signal generating circuit 13 and the second control signal generating circuit 14, respectively, may be applied directly to the terminals on the opposite sides of the MOS capacitor 3.

The first control signal generating circuit 13 and the second control signal generating circuit 14 generate control signals based on the same potential so as not to allow the capacitance value of the MOS capacitor 3 to be affected by variation in the power source voltage. For example, the control signals from both the circuits may be based on the ground potential.

Among AT-cut crystal resonators, there is included a crystal resonator, called a flat crystal, having no frequency deviation caused by differences in temperature in the proximity of room temperature (generally, from 15° C. to 45° C.). The frequency deviation of the crystal oscillation circuit employing this flat crystal, in the temperature range of 15° C. to 45° C., falls within a tolerable deviation for the temperature-compensated crystal oscillator. However, the same exhibits a cubic curve temperature characteristic in the temperature region not higher than 15° C. and in the temperature region not lower than 45° C.

It would be useful to have a good understanding of the electrical characteristics of a MOS capacitor to understand the effectiveness of the first embodiment as shown in FIG. 1.

Figure 2:
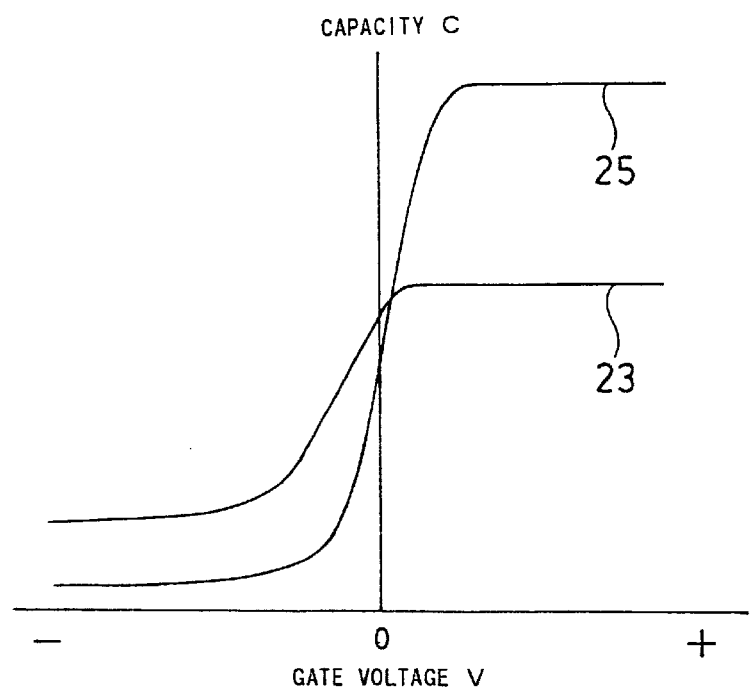
FIG. 2 is a diagram showing the C-V curve characteristic of a MOS capacitor employed in the temperature-compensated crystal oscillator according to the invention by way of example.

For such a purpose, the electrical characteristics of a MOS capacitor is first described hereinafter. FIG. 2 illustrates the electrical characteristics of a MOS capacitor by way of example.

FIG. 2 shows the electrical characteristics of a MOS capacitor comprising an n-type semiconductor substrate and an n-type gate electrode, illustrating the relation between the voltage of the gate electrode in relation to the semiconductor substrate (the opposite electrode) and its capacitance value. The electrical characteristic described is generally called a C-V curve.

In FIG. 2, there are illustrated two C-V curves showing the relation between the gate electrode (V) and the capacitance value (C), that is, a curve 23 representing the case of a heavily doped n-type semiconductor substrate with a thick gate insulation layer, and a curve 25 representing the case of a lightly doped n-type semiconductor substrate with a thin gate insulation layer.

As is evident from the figure, the MOS capacitor needs to be fabricated not under conditions of the heavily doped n-type semiconductor substrate with the thick gate insulation layer as expressed by the C-V curve 23, but under conditions of the lightly doped n-type semiconductor substrate with the thin gate insulation layer as expressed by the C-V curve 25 in order to increase its physical capacitance variation ratio.

However, as the graph in FIG. 2 shows, the C-V curve 25 for the lightly doped semiconductor substrate with the thin gate insulation layer is shifted towards the right side (on the plus side of the gate voltage) of the C-V curve 23 for the heavily doped semiconductor substrate with the thick gate insulation layer.

Such a shift of the C-V curve represents the same phenomenon as a shift in the threshold voltage of the MOS transistor, and such shift in the characteristic is unavoidable when the gate insulation layer is rendered thinner or the impurity concentration in the semiconductor substrate is lowered.

Further, when the semiconductor substrate is connected to a power source or to ground as in the conventional case, only a portion of the C-V curve, either on the plus side of the gate voltage or on the minus side of the gate voltage, can be put to use unless a booster circuit or the like is employed.

Consequently, with a MOS capacitor having the characteristic as represented by the C-V curve 25 for the lightly doped semiconductor substrate with the thin gate insulation layer, the capacitance variation ratio in the range of practical application voltages will become small even if the physical capacitance variation ratio is increased.

In order to cause the C-V curve to be shifted to the left side (towards the minus side of the gate voltage) in the graph with the physical capacitance variation ratio kept at a large value, it is necessary to change the material for the gate electrode to a material having a stronger tendency of donating electrons than that for an ordinary n-type material, that is, a material having a smaller work function.

However, a material meeting such conditions without adversely affecting the electrical characteristic of a semiconductor IC has not been discovered as yet.

Hence, the capacitance variation ratio in the range of application voltages must be increased by devising a suitable application method of the MOS capacitor rather than by improving the electrical characteristic thereof.

In respective embodiments of the invention, such application methods of the MOS capacitor are devised, and the first embodiment of the invention shown in FIG. 1 represents one such method.

As shown in FIG. 1, the MOS capacitor 3 is cut off in terms of DC from circuits having a DC voltage such as the amplifier 11 and the like by the AT-cut crystal resonator 1, and the first fixed capacitor 5.

Accordingly, the first control signal generating circuit 13 and second control signal generating circuit 14 are able to output an optional voltage, respectively, within the power source voltage range.

If the second control signal generating circuit 14 outputs a voltage equivalent to about half of the power source voltage, and the output of the first control signal generating circuit 13 varies from ground level to the power source voltage, this will correspond to a case of utilizing the C-V curve, shown in FIG. 2, in a range from the minus gate voltage region to the plus gate voltage region.

Consequently, with a MOS capacitor having the characteristic represented by the C-V curve 25 for the lightly doped semiconductor substrate with the thin gate insulation layer, a range where capacitance variation is at the maximum can be utilized, resulting in significant improvement of the capacitance variation ratio in comparison with that in the case of the conventional configuration.

Improvement in the capacitance variation ratio of the MOS capacitor 3 leads to an increase in the width of the variable frequency band of the AT-cut crystal resonator 1, and therefore, according to the first embodiment of the invention shown in FIG. 1, a temperature-compensated crystal oscillator having a wide range of temperature compensation can be provided.

The second fixed capacitor 21 is installed in order to adjust a load capacitance or to secure the width of the variable frequency band.

Meanwhile, with the temperature-compensated crystal oscillator according to the invention, not only an increase in the capacitance variation ratio of the MOS capacitor as a variable capacitance element but also signal synthesis of a first control signal outputted by the first control signal generating circuit 13 with a second control signal outputted from the second control signal generating circuit 14, for temperature compensation, are in effect achieved.

More specifically, the capacitance value of the MOS capacitor 3 in FIG. 1 is controlled by the potential difference between the first control signal S1 outputted by the first control signal generating circuit 13 and the second control signal S2 outputted by the second control signal generating circuit 14, and variation in the capacitance value causes frequency to change. Therefore, the configuration of the first embodiment constitutes a type of potential difference detection circuit.

The potential difference is equivalent to addition of one of the control signals, after being inverted, to the other, for example, S1+(−S2), and the addition represents a type of signal synthesis.

Accordingly, the circuit configuration shown in FIG. 1 in effect results in formation of a signal synthesis circuit for the first control signal S1 and second control signal S2.

In the temperature-compensated crystal oscillator according to the invention, the circuit for generating a temperature compensation signal can be simplified owing to the effect of signal synthesis performed by the MOS capacitor 3.

Now, temperature compensation is explained in the case of the AT-cut crystal resonator 1 employed in the crystal oscillation circuit 10 being a crystal resonator, a so-called flat crystal, having hardly any variation in frequency due to temperature differences in the proximity of room temperature, in the range of 15° C. to 45° C. as described in the foregoing.

With the crystal oscillation circuit 10 employing the AT-cut crystal resonator 1 having such characteristics, temperature compensation can be achieved simply by effecting rectilinear correction of the temperature characteristic of frequency on the lower temperature side not higher than 15° C. as well as on the higher temperature side not lower than 45° C. along the extension of a portion of the curve representing the temperature characteristic in the proximity of room temperature.

In this case, if there is only one variable capacitance element, it is necessary to combine a rectilinear correction signal on the lower temperature side with a rectilinear correction signal on the higher temperature side in order to execute temperature compensation over the entire temperature range.

Figure 3:
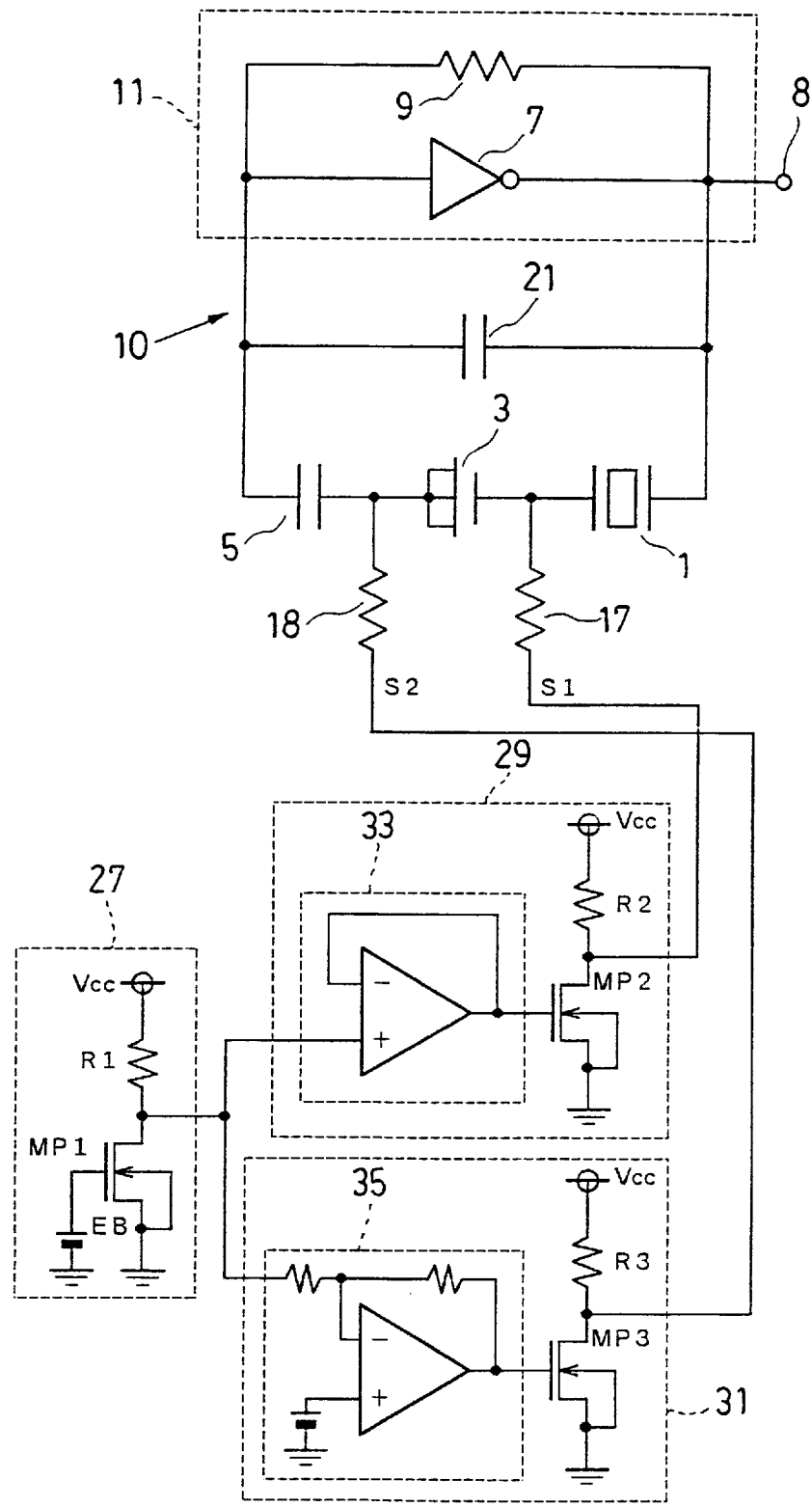
FIG. 3 is a circuit diagram showing a specific example of first and second control signal generating circuits according to the first embodiment shown in FIG. 1.

However, since the MOS capacitor 3 in the crystal oscillation circuit 10 shown in FIG. 3 serves as the signal synthesis circuit as well, rectilinear correction can be achieved over the entire range from the lower temperature side to the higher temperature side by use of the first control signal generating circuit 13 serving as a rectilinear correction signal generating circuit on the lower temperature side, and the second control signal generating circuit 14 serving as a rectilinear correction signal generating circuit on the higher temperature side.

This will enable one signal synthesis circuit to be dispensed with in the stage of generating the control signals, contributing to simplification of the circuit for generating the temperature compensation signal.

An example of a configuration wherein a MOS transistor is used as the rectilinear correction signal generating circuit on the lower temperature side, or as the rectilinear correction signal generating circuit on the higher temperature side, has been disclosed in Japanese Patent Application No. 9-156791, applied for by the same applicant as the present application.

With the configuration described above, rectilinear correction is executed by use of the square-law curve signals generated by two MOS transistors, approximated to a portion on the lower temperature side and the higher temperature side, respectively, of the cubic curve representing the temperature characteristic of the AT-cut crystal resonator.

FIG. 3 shows a specific example of a circuit wherein a circuit for executing such rectilinear correction is applied to the first embodiment of the invention shown in FIG. 1.

FIG. 3 is a circuit diagram showing an example of generating square-law curve signals by taking advantage of the current-voltage characteristic of the square-law region of the MOS transistors, and controlling a MOS capacitor with the square-law curve signals as rectilinear correction signals.

In FIG. 3, a temperature sensor 27 is made up of a series connection of an n-channel MOS transistor MP1 and a resistor R1, and a DC power source EB for applying a constant gate voltage to the MOS transistor MP1. A temperature detection signal outputted from the temperature sensor 27 is delivered to a square-law converter circuit 29 on the lower temperature side and a square-law converter circuit 31 on the higher temperature side.

The square-law converter circuit 29 on the lower temperature side is made up of a noninverting amplifier 33 by use of an operational amplifier (op-amp), and a series connection of an n-channel MOS transistor MP2 and a resistor R2, while the square-law converter circuit 31 on the higher temperature side is made up of an inverting amplifier 35 by use of an op-amp, and a series connection of an n-channel MOS transistor MP3 and a resistor R3.

The configuration of the crystal oscillation circuit 10 is the same as that shown in FIG. 1, in that an AT-cut crystal resonator 1, a MOS capacitor 3, and a first fixed capacitor 5 are coupled in series. This series connection is connected in parallel with an amplifier 11 and a second fixed capacitor 21.

The MOS capacitor 3 comprises an n-type semiconductor substrate and an ntype gate electrode, and made up of a lightly doped semiconductor substrate and a thin gate insulation layer.

A rectilinear correction signal generating circuit on the lower temperature side, corresponding to the first control signal generating circuit 13 in FIG. 1, is made up of the temperature sensor 27 and the square-law converter circuit 29 on the lower temperature side, and a rectilinear correction signal on the lower temperature side is outputted as a first control signal S1 from a node between the MOS transistor MP2 and resistor R2, and is applied to the gate electrode of the MOS capacitor 3 via an input resistor 17.

Also, a rectilinear correction signal generating circuit on the higher temperature side, corresponding to the second control signal generating circuit 14 in FIG. 1, is made up of the temperature sensor 27 and the square-law converter circuit 31 on the higher temperature side, and a rectilinear correction signal on the higher temperature side is outputted as a second control signal S2 from a node between the MOS transistor MP3 and resistor R3, and is applied to the opposite electrode of the MOS capacitor 3 via an input resistor 18.

In the temperature sensor 27, when the gate voltage of the MOS transistor MP1 is constant at around the threshold voltage plus 0.2 V, an output (voltage) of the drain thereof undergoes substantially linear change in relation to variation in temperature.

A voltage generated by amplification of the output of the temperature sensor 27 through the noninverting amplifier 33 is impressed on the gate of the MOS transistor MP2 in the square-law converter circuit 29 on the lower temperature side. Specifically, the voltage increases linearly as temperature declines.

If the gate voltage is set to become equivalent to the threshold voltage of the MOS transistor MP2 at around 15° C. by, for example, adjusting an amplification factor of the noninverting amplifier 33, a gate voltage higher than the threshold voltage is impressed on the MOS transistor MP2 proportional as temperature declines in the temperature range not higher than 15° C.

When a voltage not lower than the threshold voltage is impressed on the gate of the MOS transistor MP2, the value of current flowing between the source and drain thereof is proportional to the square of a difference between the gate voltage and the threshold voltage. Accordingly, the square-law converter circuit 29 on the lower temperature side outputs a square-law curve signal from the drain of the MOS transistor MP2 proportional as temperature declines in the temperature region not higher than 15° C.

Meanwhile, a signal (voltage) generated by inverting and amplifying the output of the temperature sensor 27 through the inverting amplifier 35 is impressed on the gate of the MOS transistor MP3 of the square-law converter circuit 31 on the higher temperature side. Specifically, the voltage increases linearly as temperature rises.

If the gate voltage is set to become equivalent to the threshold voltage of the MOS transistor MP3 at around 45° C. by, for example, adjusting an amplification factor of the inverting amplifier 35, a gate voltage higher than the threshold voltage is impressed on the MOS transistor MP3 proportional as temperature rises in the temperature range not lower than 45° C. Accordingly, the square-law converter circuit 31 on the higher temperature side outputs a square-law curve signal from the drain of the MOS transistor MP3 proportional as temperature rises in the temperature region not lower than 45° C.

Figure 4:
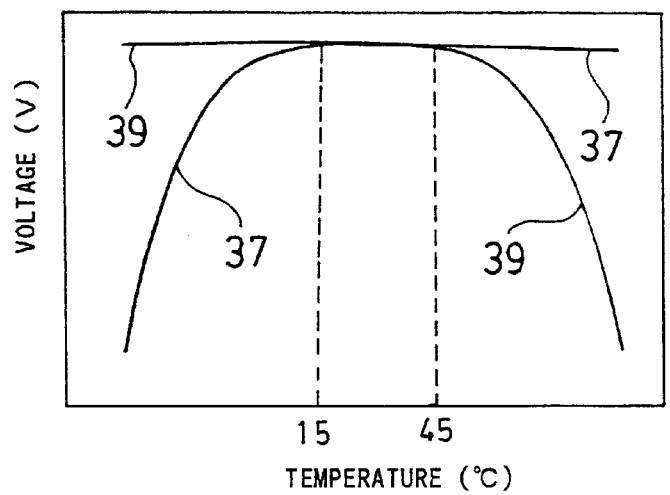
FIG. 4 is a diagram showing an example of square-law curve signals used in the temperature-compensated crystal oscillator according to the invention.

FIG. 4 shows examples of the square-law curve signals generated by taking advantage of the characteristic of the square law region of these MOS transistors.

As shown in FIG. 4, the voltage of the square-law curve signal 37 on the lower temperature side, generated by the square-law converter circuit 29 on the lower temperature side, drops in proportion to the square of the temperature difference from 15° C. as temperature declines from 15° C. to the lower side, but remains constant above 15° C.

Mean while, the voltage of the square-law curve signal 39 on the higher temperature side, generated by the square-law converter circuit 31 on the higher temperature side, drops in proportion to the square of the temperature difference from 45° C. as temperature rises from 45° C. to the higher side, but remains constant below 45° C.

Then, as shown in FIG. 3, the output of the square-law converter circuit 29 on the lower temperature side is delivered to the gate electrode of the MOS capacitor 3 via the input resistor 17 while the output of the square-law converter circuit 31 on the higher temperature side is delivered to the opposite electrode of the MOS capacitor 3 via the in put resistor 18.

Accordingly, on the lower temperature side not higher than 15° C., the gate electrode of the MOS capacitor 3 is at a lower potential than the opposite electrode, and on the higher temperature side not lower than 45° C., the gate electrode of the MOS capacitor 3 is at a higher potential se the opposite electrode.

Since the MOS capacitor 3 comprises an n-type semiconductor substrate and an n-type gate electrode, made up of the lightly doped semiconductor substrate and the thin gate insulation layer, the characteristic thereof is as represented by the C-V curve 25 in FIG. 2. Hence, the capacitance value of the MOS capacitor 3 decreases on the lower temperature side not higher than 15° C., and increase on the higher temperature side not lower than 45° C.

If the capacitance value of the MOS capacitor 3 decreases, the oscillation frequency of the crystal oscillation circuit 10 becomes higher, and if the capacitance value of the MOS capacitor 3 increases, the oscillation frequency of the crystal oscillation circuit 10 becomes lower.

Since the square-law curve signals generated by the square-law converter circuit 29 on the lower temperature side and the square-law converter circuit 31 on the higher temperature side have waveforms approximated with high precision to the curved portions of the temperature characteristic of the AT-cut crystal resonator, temperature compensation for the crystal oscillation circuit 10 employing the flat crystal as the AT-cut crystal resonator 1 can be achieved with the configuration shown in FIG. 3.

In the temperature-compensated crystal oscillator shown in FIG. 3, the square-law converter circuit 29 on the lower temperature side and the square-law converter circuit 31 on the higher temperature side have the temperature sensor 27 for common use. However, such a configuration is not essential, and an independent temperature sensor on the lower temperature side and higher temperature side, respectively, may be installed.

Meanwhile, an AT-cut crystal resonator generally has not only the temperature characteristic of the flat crystal but also a temperature characteristic with a constant gradient added thereto over the entire temperature range.

Even with the use of such an AT-cut crystal resonator, temperature compensation can be achieved in the first embodiment described with reference to FIG. 1 by adding a gladient correction signal to either of the first control signal generating circuit 13 or the second control signal generating circuit 14.

In this case, the temperature-compensated crystal oscillator may comprise three signal generating circuits, consisting of the rectilinear correction signal generating circuit on the lower temperature side, the rectilinear correction signal generating circuit on the higher temperature side, and a gradient correction signal generating circuit. Two optional signals generated by two circuits among the circuits described above may be synthesized in the first control signal generating circuit 13, and the second control signal generating circuit 14 may serve as one remaining signal generating circuit. However, the second control signal generating circuit 14 may instead be a circuit for synthesizing the two optional signals.

In the case where the two optional signals are the rectilinear correction signal generating circuit on the lower temperature side and the rectilinear correction signal generating circuit on the higher temperature side, signal synthesis may be executed by an interior division circuit employing two resistors.

Then, in the case where either of the optional two signals is the gradient correction signal, signal synthesis may be executed by an inverting amplifier wherein the gradient correction signal is used as an inversion point while the other signal is inputted.

The gradient correction signal generating circuit is a circuit for executing proportional conversion of the output of the temperature sensor.

Further, there can be a case where some AT-cut crystal resonator has a temperature characteristic curve with a difference in gradient between the lower temperature side and higher temperature side, in which case a broken-line signal generating circuit is substituted for the gradient correction signal generating circuit.

In addition, an AT-cut crystal resonator generally requires not only temperature compensation but also overall adjustment for frequency shift (called 'f-zero' adjustment).

Even in such a case, a temperature-compensated crystal oscillator capable of generating frequency with excellent precision can be provided by adding an f-zero adjustment signal to either of the first control signal generating circuit 13 or the second control signal generating circuit 14 in the first embodiment described with reference to FIG. 1.

In such a case, the temperature-compensated crystal oscillator has a configuration comprising four signal generating circuits, that is, the rectilinear correction signal generating circuit on the lower temperature side, the rectilinear correction signal generating circuit on the higher temperature side, the gradient correction signal generating circuit, and an f-zero adjustment signal generating circuit.

Then, two optional signals generated by two circuits among the aforesaid circuits may be synthesized in the first control signal generating circuit 13 and the remaining two signals may be synthesized in the second control signal generating circuit 14.

Otherwise, three optional signals may be synthesized in the first control signal generating circuit 13, and the second control signal generating circuit 14 may be used as a circuit for generating the remaining signal, or the second control signal generating circuit 14 may instead be a circuit for synthesizing the three signals.

In the case of the three optional signals being the rectilinear correction signal on the lower temperature side, the rectilinear correction signal on the higher temperature side, and the gradient correction signal, a synthesized signal resulting therefrom is a temperature compensation signal.

Even though the temperature compensation signal is generated by synthesizing the signals, it is important in reducing the cost of the temperature-compensated crystal oscillator to generate the temperature compensation signal by generating component signals thereof, that is, the rectilinear correction signals and the gradient correction signal first, separately, instead of generating the temperature compensation signal directly.

The f-zero adjustment signal generating circuit is easily formed by a nonvolatile memory and a D/A converter circuit, and since there is nothing special about this circuit, detailed description thereof is omitted.

Further, depending on the specification of the cellular phone, a function for adapting the oscillation frequency to the standard frequency of the base station by means of an external frequency control signal is required.

In such a case, the external frequency control signal may be added to either of the first control signal generating circuit 13 or the second control signal generating circuit 14 in the first embodiment described with reference to FIG. 1.

However, as the voltage width of the external frequency control signal occupies a half portion or more in the power source voltage, use of the external frequency control signal as it is will render the voltage width of the control signal, required for temperature compensation or the like, insufficient for the purpose.

Hence, there will arise a need for an external frequency control proportion signal generating circuit for compressing the voltage width of the external frequency control signal through proportional conversion thereof.

It follows that a temperature-compensated crystal oscillator of such specification has a configuration comprising five signal generating circuits, that is, the rectilinear correction signal generating circuit on the lower temperature side, the rectilinear correction signal generating circuit on the higher temperature side, the gradient correction signal generating circuit, the f-zero adjustment signal generating circuit, and the external frequency control proportion signal generating circuit.

In this case, four optional signals generated by four circuits among the aforesaid circuits may be synthesized in the first control signal generating circuit 13, and the second control signal generating circuit 14 may be used as a circuit for generating the remaining signal.

Otherwise, three optional signals generated by three circuits among the aforesaid circuits may be synthesized in the first control signal generating circuit 13, and the two remaining signals may be synthesized in the second control signal generating circuit 14. Needless to say, the second control signal generating circuit 14 may be used as a circuit for synthesizing the four or three optional signals instead.

Whatever combination of signals to be synthesized is adopted, a type of signal synthesis circuit is formed by controlling the opposite terminals of the MOS capacitor 3 with two signals, thereby synthesizing all the signals.

Accordingly, with the first embodiment shown in FIG. 1, a temperature-compensated crystal oscillator capable of eliminating mutual interference between temperature compensation and external frequency control can be provided.

As is evident from the foregoing description, according to the first embodiment of the invention, a temperature-compensated crystal oscillator having a wide range of temperature compensation can be produced by use of one MOS capacitor for controlling capacitance values of the two control signals.

Second to Seventh Embodiments: FIGS. 5 to 11

Now, application of the MOS capacitor is not limited to that adopted in the first embodiment of the invention. Various other embodiments of the invention, wherein a temperature-compensated crystal oscillator having a wide range of temperature compensation is produced by use of one MOS capacitor, are described hereinafter.

In FIGS. 5 to 11 showing the configurations of respective embodiments, parts corresponding to those in FIG. 1 are denoted by the same reference numerals, and description thereof is omitted.

Figure 5:
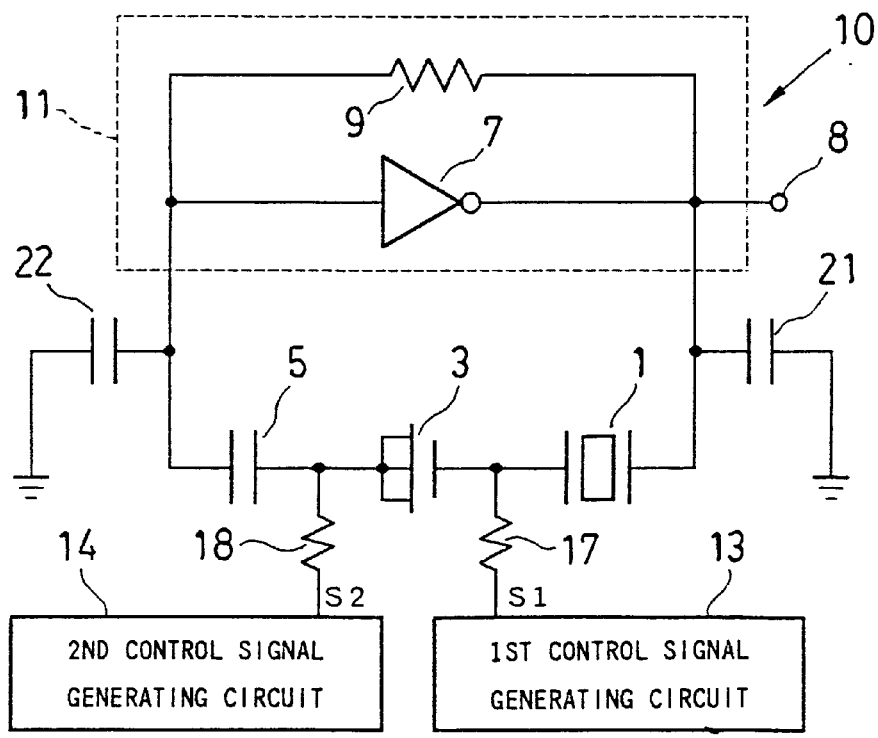
FIGS. 5 to 10 are block circuit diagrams showing the configurations of second to seventh embodiments of a temperature-compensated crystal oscillator according to the invention, respectively.

FIG. 5 is a block circuit diagram showing the configuration of a second embodiment of a temperature-compensated crystal oscillator according to the invention.

As opposed to the first embodiment shown in FIG. 1 wherein the second fixed capacitor 21 is coupled in parallel with the amplifier 11, the second embodiment differs from the first embodiment in that a second fixed capacitor 21 and a third fixed capacitor 22 are coupled to a node between the output terminal of the amplifier 11 and an optional constant voltage source (which in this case is the ground), and to the other node between the input terminal of the amplifier 11 and the optional constant voltage source, respectively.

The temperature-compensated crystal oscillator according to the second embodiment is equivalent to the first embodiment as an AC circuit However, in the second embodiment, upon turning on the power, potentials at the opposite terminals of the amplifier 11 come down to the ground level for an instant, and oscillation startup is therefore improved over that for the temperature-compensated crystal oscillator according to the first embodiment.

Figure 6:
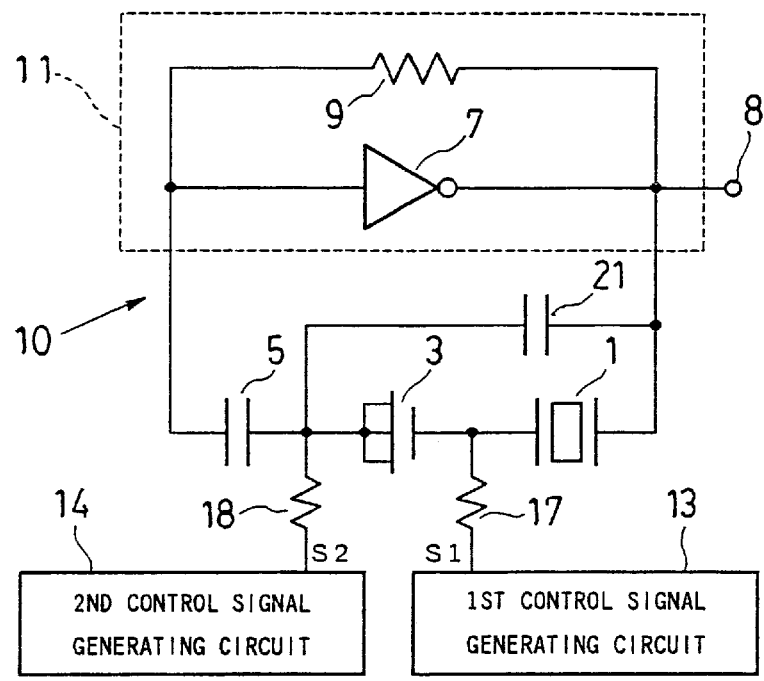

FIG. 6 is a block circuit diagram showing the configuration of a third embodiment of a temperature-compensated crystal oscillator according to the invention.

The temperature-compensated crystal oscillator according to the third embodiment differs from the first embodiment shown in FIG. 1 only in respect of a part of the way in which a second fixed capacitor 21 is coupled, and otherwise, both the configuration and function thereof are equivalent to those of the temperature-compensated crystal oscillator according to the first embodiment.

That is, in the temperature-compensated crystal oscillator according to the third embodiment shown in FIG. 6, the second fixed capacitor 21 is coupled in parallel with series connection of an AT-cut crystal resonator and a MOS capacitor 3.

Figure 7:
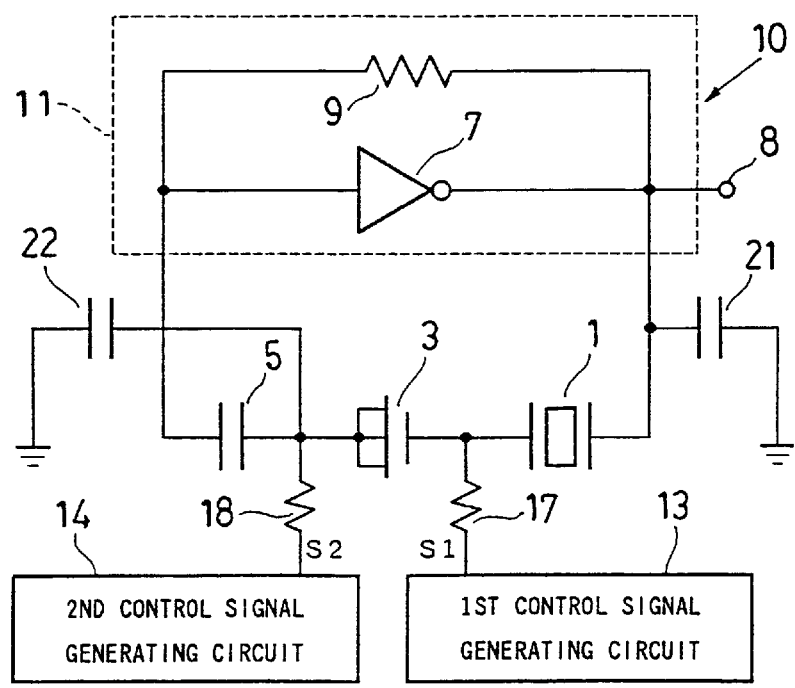

FIG. 7 is a block circuit diagram showing the configuration of a fourth embodiment of a temperature-compensated crystal oscillator according to the invention.

The temperature-compensated crystal oscillator according to the fourth embodiment differs from the same according to the second embodiment only in respect of part of the way in which a third fixed capacitor 22 is coupled.

That is, in the fourth embodiment shown in FIG. 7, a second fixed capacitor 21 is extended between an optional constant voltage source (in this case, the ground) and a node between a MOS capacitor 3 and a first fixed capacitor 5.

Figure 8:
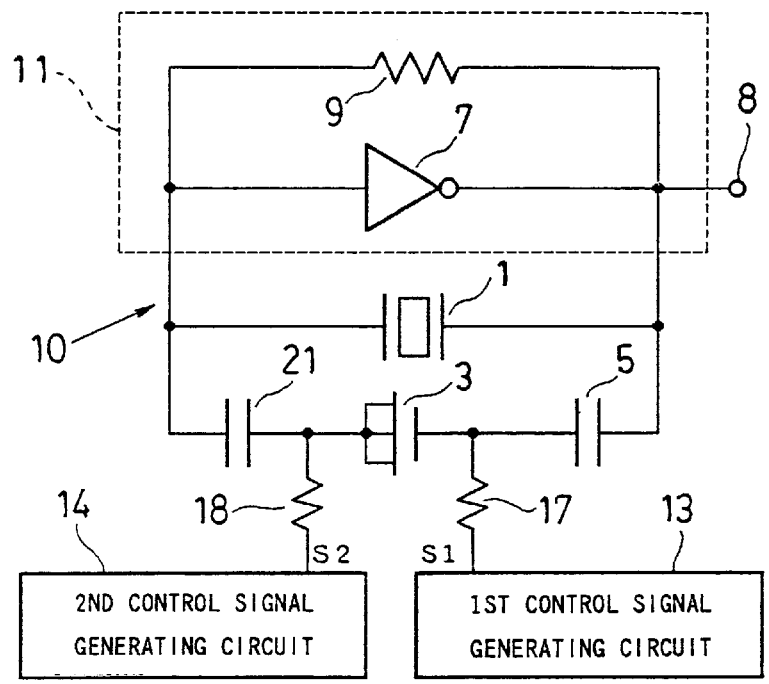

FIG. 8 is a block circuit diagram showing the configuration of a fifth embodiment of a temperature-compensated crystal oscillator according to the invention.

In the temperature-compensated crystal oscillator according to the fifth embodiment, a variable capacitance circuit as a whole, formed of series connection of a first fixed capacitor 5, MOS capacitor 3, and second fixed capacitor 21, is coupled in parallel with an AT-cut crystal resonator 1.

Such a configuration has the effect of changing the capacitance ratio of the AT-cut crystal resonator 1 directly so that with a small change in the capacitance of the variable capacitance circuit, the oscillation frequency of the AT-cut crystal resonator 1 can be varied significantly.

Figure 9:
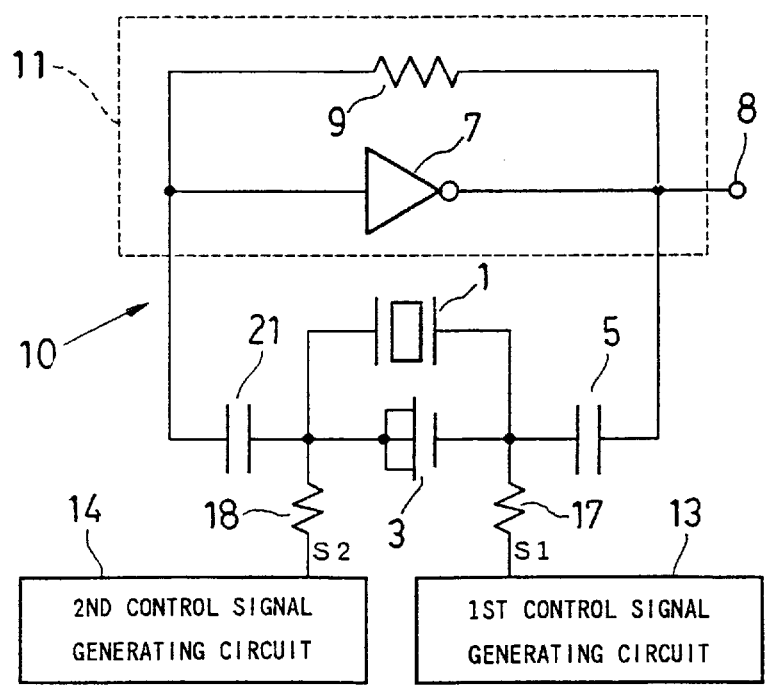

FIG. 9 is a block circuit diagram showing the configuration of a sixth embodiment of a temperature-compensated crystal oscillator according to the invention.

In the temperature-compensated crystal oscillator according to the sixth embodiment, a variable capacitance circuit is formed of series connection of a first fixed capacitor 5, MOS capacitor 3, and second fixed capacitor 21 as in the fifth embodiment. However, the MOS capacitor 3 is coupled in parallel with an AT-cut crystal resonator 1.

With such a configuration, the maximum capacitance of the MOS capacitor 3 can be set at a small value not more than 10 pF.

Figure 10:
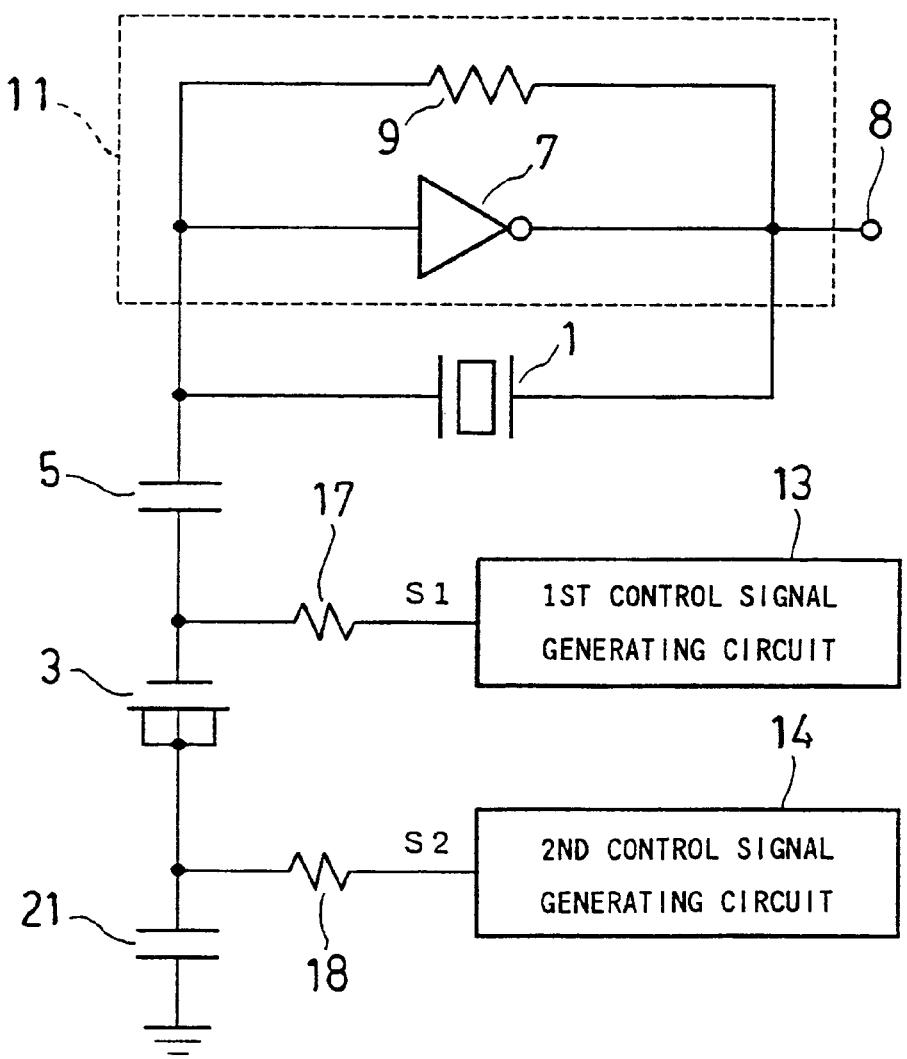
Figure 11:
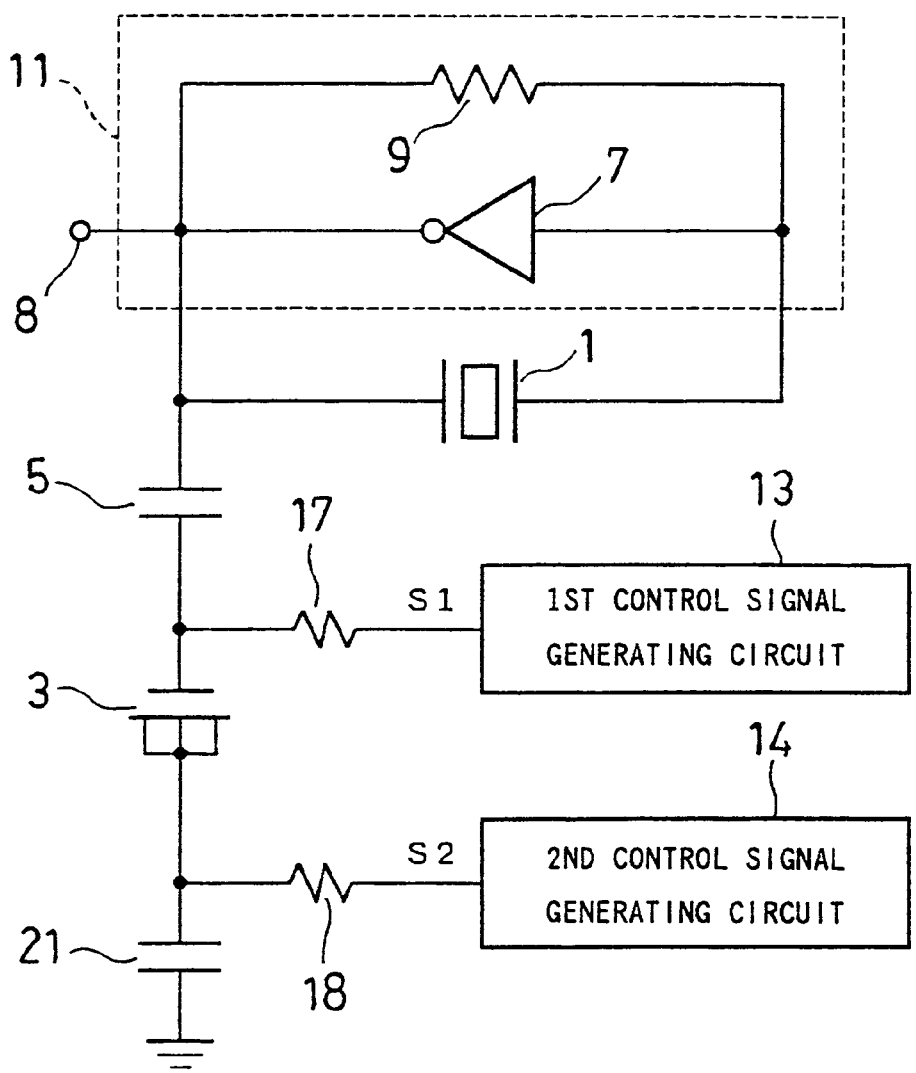
FIG. 11 is a block circuit diagram showing an example of a variation of the seventh embodiment of the invention.

FIGS. 10 and 11 are block circuit diagrams showing the configuration of a seventh embodiment of a temperature-compensated crystal oscillator according to the invention.

As shown in FIGS. 10 and 11, in the temperature-compensated crystal oscillator according to the seventh embodiment, a variable capacitance circuit formed of series connection of a first fixed capacitor 5, MOS capacitor 3, and second fixed capacitor 21 is extended between one end of a parallel connection of an AT-cut crystal resonator 1 and amplifier 11, and an optional constant voltage source (in this case, the ground).

As shown in FIG. 11, the series connection described above may be coupled to the output side of an oscillation inverter 7 of the amplifier 11, but may preferably be coupled to the input side of the oscillation inverter 7 as shown in FIG. 10 because a variable frequency band can become wider in this way.

In the temperature-compensated crystal oscillator according to the respective embodiments as well, a first control signal generating circuit 13 and second control signal generating circuit 14 may be a rectilinear correction signal generating circuit 29 on the lower temperature side, and rectilinear correction signal generating circuit 31 on the higher temperature side, respectively, comprising the temperature sensor 27 and the square-law converter circuit 29 on the lower temperature side and the square-law converter circuit 31 on the higher temperature side, respectively, as described in the first embodiment shown in FIG. 3.

Otherwise, the gradient correction signal generating circuit, the f-zero adjustment signal generating circuit, the external frequency control proportion signal generating circuit, and so forth, as described in the foregoing, may be further installed, and four or three optional signals among signals generated by the aforesaid circuits may be synthesized in the first control signal generating circuit 13 while the one or two remaining signals may be generated or synthesized in the second control signal generating circuit 14. Needless to say, four or three optional signals may be synthesized in the second control signal generating circuit 14 instead.

Eighth to Eleventh Embodiments: FIGS. 12 to 15

Next, embodiments of the invention, employing two MOS capacitors, are described hereinafter.

Figure 12:
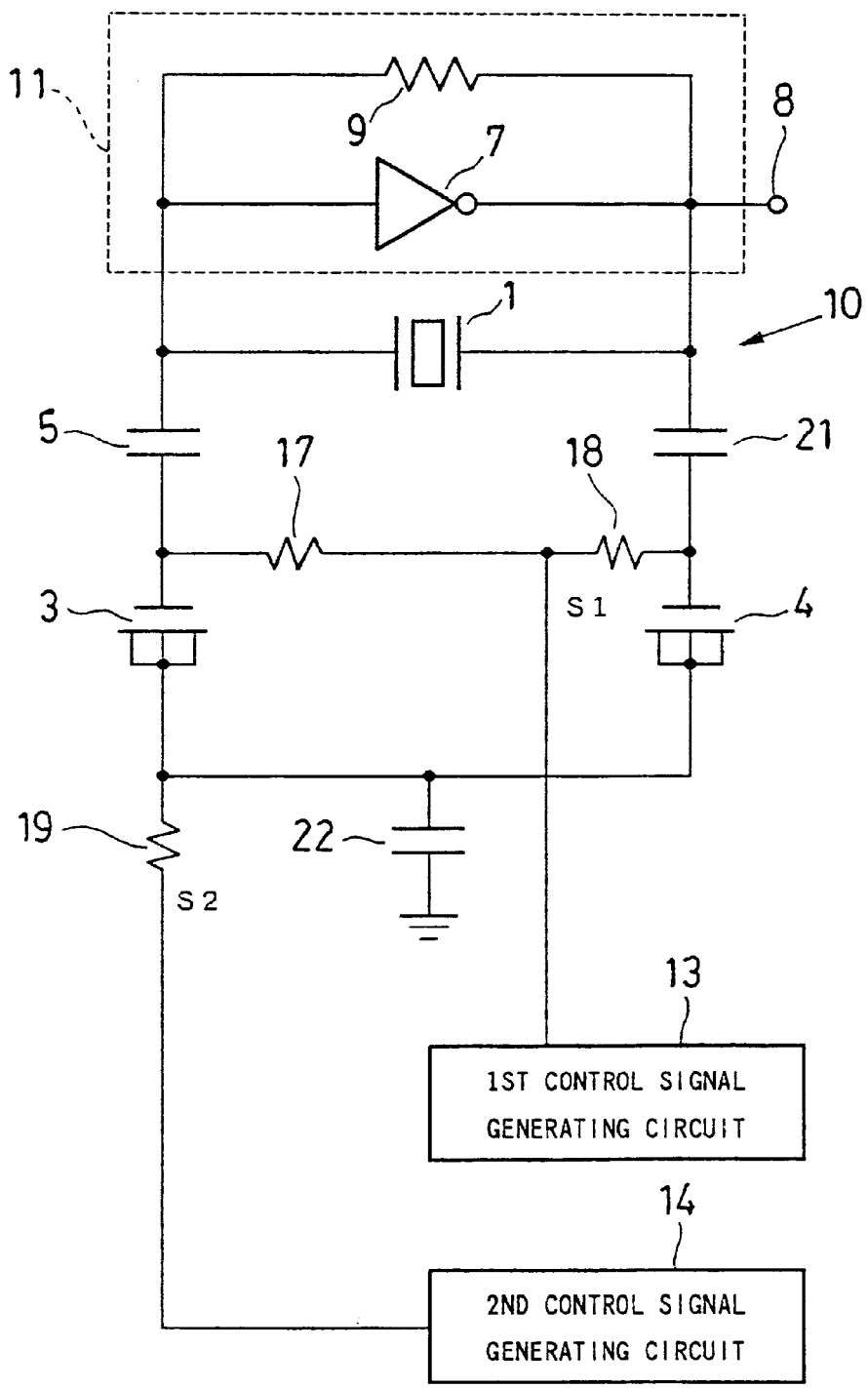
FIGS. 12 to 15 are block circuit diagrams showing the configurations of eighth to eleventh embodiments of a temperature-compensated crystal oscillator according to the invention, respectively.

FIG. 12 is a block circuit diagram showing the configuration of an eighth embodiment of a temperature-compensated crystal oscillator according to the invention.

As shown in FIG. 12, in the temperature-compensated crystal oscillator according to the eighth embodiment, an AT-cut crystal resonator 1 and an amplifier 11 are connected in parallel, and a series connection of a first fixed capacitor 5, a first MOS capacitor 3, a second MOS capacitor 4 and a second fixed capacitor 21 are coupled in parallel with the AT-cut crystal resonator 1, making up a crystal oscillation circuit 10. Further, a third fixed capacitor 22 is extended between a node for coupling the first MOS capacitor 3 with the second MOS capacitor 4 and an optional constant potential source (in this case, the ground).

The amplifier 11 comprises a parallel connection of an oscillating inverter 7 and a feedback resistor 9 as in the case of the previously described embodiments.

The output terminal of a first control signal generating circuit 13 for temperature compensation is connected via a first input resistor 17 to a node between the first fixed capacitor 5 and the first MOS capacitor 3 of the crystal oscillation circuit 10, while a second input resistor 18 is extended between a node for coupling the second fixed capacitor 21 with the second MOS capacitor 4 and the output terminal of the first control signal generating circuit 13.

Further, the output terminal of a second control signal generating circuit 14 for temperature compensation is connected via a third resistor 19 to a node for coupling the first MOS capacitor 3 with the second MOS capacitor 4.

The first input resistor 17, the second input resistor 18, and the third input resistor 19 have the function of allowing passage of DC signals and blocking AC signals, respectively, and if both the first control signal generating circuit 13 and the second control signal generating circuit 14 have a sufficiently high output impedance, control signals outputted from the respective circuits may be impressed directly on the MOS capacitors 3, and 4 instead of via the input resistors described above.

However, both the first input resistor 17, and the second input resistor 18, together cannot be dispensed with.

The first control signal generating circuit 13 and second control signal generating circuit 14 generate control signals, respectively, based on the same potential so as not to allow the capacitance value of the first MOS capacitor 3 as well as the second MOS capacitor 4 to be affected by variation in the power source voltage. For example, the control signals from both the circuits may be based on the ground potential.

As already described with reference to the first embodiment, it is important to achieve reduction in cost so that the temperature-compensated crystal oscillator employing a common type AT-cut crystal resonator has a configuration comprising four signal generating circuits, that is, the rectilinear correction signal generating circuit on the lower temperature side, the rectilinear correction signal generating circuit on the higher temperature side, the gradient correction signal generating circuit, and the f-zero adjustment signal generating circuit.

Otherwise, in the case of the specification of a cellular phone requiring a function for adapting the oscillation frequency to the standard frequency of the base station by means of an external frequency control signal, the temperature-compensated crystal oscillator should adopt a configuration comprising five signal generating circuits, that is, the rectilinear correction signal generating circuit on the lower temperature side, the rectilinear correction signal generating circuit on the higher temperature side, the gradient correction signal generating circuit, the f-zero adjustment signal generating circuit, and an external frequency control proportion signal generating circuit.

There is no constraint on how to portion out the functions of the four or five signal generating circuits between the first control signal generating circuit 13 and second control signal generating circuit 14, except that the functions portioned out must not overlap. This is because all the signals, no matter how they are portioned out, are eventually synthesized so long as no overlapping occurs.

In the eighth embodiment shown in FIG. 12, since a configuration thereof allows capacitance values of the terminals on the opposite ends of the AT-cut crystal resonator 1 to be varied simultaneously, temperature compensation can be achieved while maintaining optimum balance in capacitance.

Figure 13:
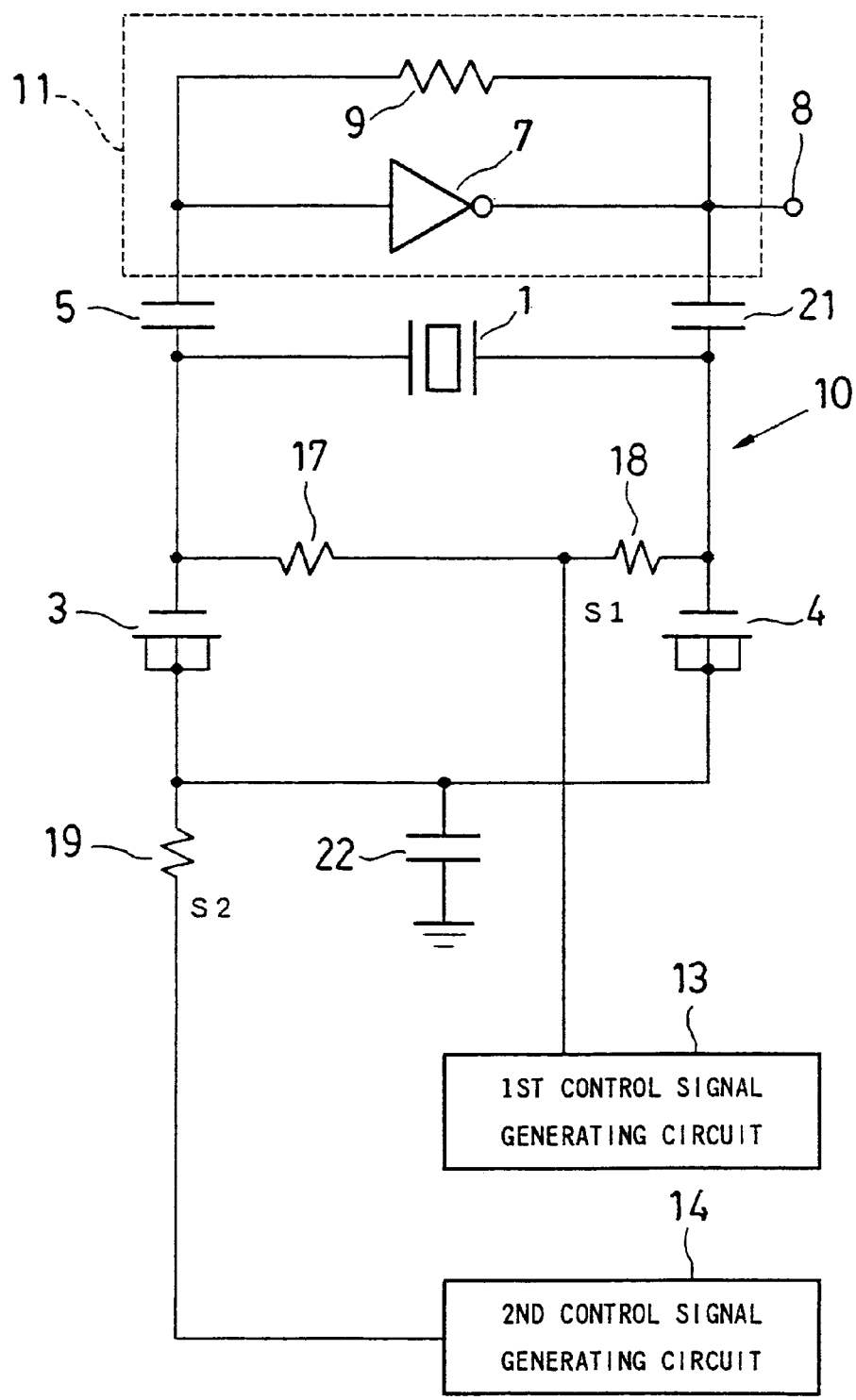

FIG. 13 is a block circuit diagram showing the configuration of a ninth embodiment of a temperature-compensated crystal oscillator according to the invention.

In the temperature-compensated crystal oscillator shown in FIG. 13, a first fixed capacitor 5, an AT-cut crystal resonator 1, and a second fixed capacitor 21 are coupled in series, and this series connection is coupled in parallel with an amplifier 11.

Further, series connection of a first MOS capacitor 3 and a second MOS capacitor 4 is coupled in parallel with the AT-cut crystal resonator 1, and a third fixed capacitor 22 is extended between a node for coupling the first MOS capacitor 3 with the second MOS capacitor 4 and an optional constant potential source (in this case, the ground), making up a crystal oscillation circuit 10.

The output terminal of a first control signal generating circuit 13 for temperature compensation is connected directly, or via a first input resistor 17 to a node between the first fixed capacitor 5 and the first MOS capacitor 3 while a second input resistor 18 is extended between a node for coupling the second fixed capacitor 21 with the second MOS capacitor 4 and the output terminal of the first control signal generating circuit 13.

Further, the output terminal of a second control signal generating circuit 14 for temperature compensation is connected directly, or via a third resistor 19, to a node for coupling the first MOS capacitor 3 with the second MOS capacitor 4.

With the ninth embodiment of the invention, the same effect of operation as that for the eighth embodiment shown in FIG. 12 can be obtained.

Figure 14:
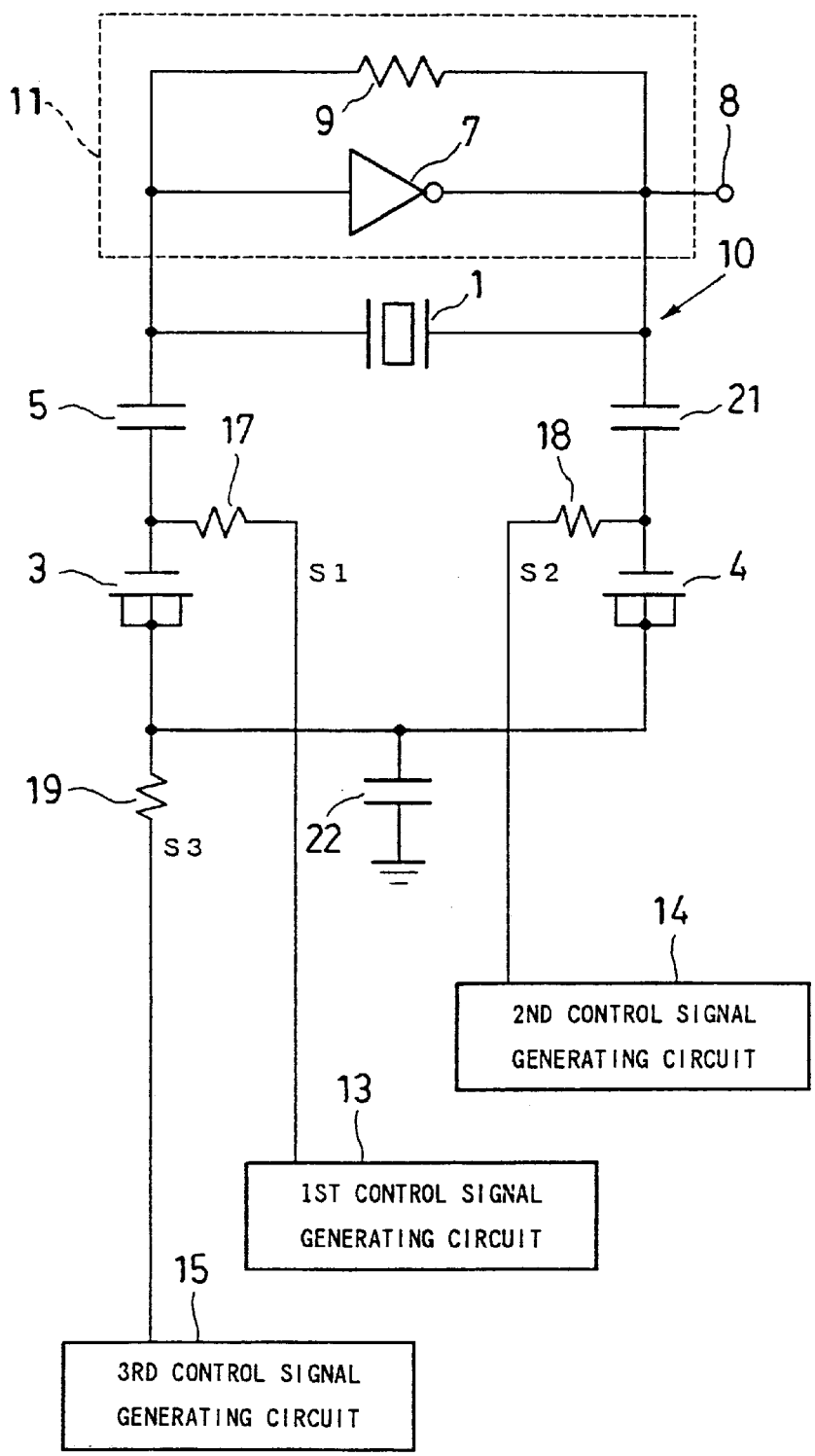

FIG. 14 is a block circuit diagram showing the configuration of a tenth embodiment of a temperature-compensated crystal oscillator according to the invention.

In the temperature-compensated crystal oscillator, an amplifier 11 comprising a parallel connection of an oscillating inverter 7 and a feedback resistor 9 is connected in parallel with an AT-cut crystal resonator 1.

A series connection of a first fixed capacitor 5, a first MOS capacitor 3, a second MOS capacitor 4, and a second fixed capacitor 21 is coupled in parallel with the AT-cut crystal resonator 1, and a third fixed capacitor 22 is extended between a node for coupling the first MOS capacitor 3 with the second MOS capacitor 4 and an optional constant potential source (in this case, the ground), making up a crystal oscillation circuit 10.

The output terminal of a first control signal generating circuit 13 is connected directly, or via a first input resistor 17, to a node between the first fixed capacitor 5 and the first MOS capacitor 3 of the crystal oscillation circuit 10.

Then, the output terminal of a second control signal generating circuit 14 is connected directly, or via a second input resistor 18, to a node between the second fixed capacitor 21 and the second MOS capacitor 4.

Furthermore, the output terminal of a third control signal generating circuit 15 is connected directly, or via a third input resistor 19, to a node for coupling the first MOS capacitor 3 with the second MOS capacitor 4.

The first, second, and third control signal generating circuits 13, 14, and 15 generate control signals, respectively, based on the same potential so as not to allow the capacitance value of the first MOS capacitor 3, as well as the second MOS capacitor 4, to be affected by variation in the power source voltage. For example, the control signals from the respective circuits may be based on the ground potential.

The respective control signal generating circuits 13, 14, and 15 are capable of outputting an optional voltage within the range of the power source voltage.

Accordingly, the width of physical capacitance variation of the first MOS capacitor 3 and the second MOS capacitor 4 can be fully utilized.

As described herinbefore, the first MOS capacitor 3 serves in effect as a signal synthesis circuit for a first control signal S1 and a third control signal S3.

Since the first control signal S1 is on a par with the second control signal S2, the second MOS capacitor 4 serves in effect as a signal synthesis circuit for the second control signal S2 and the third control signal S3.

As a result, in the tenth embodiment shown in FIG. 14, the pair of the first MOS capacitor 3 and the second MOS capacitor 4 can serve as a signal synthesis circuit for the three signals, that is, the first control signal S1, second control signal S2, and third control signal S3.

As already mentioned in describing the first embodiment, it is important to achieve reduction in cost so that the temperature-compensated crystal oscillator employing a common type AT-cut crystal resonator has a configuration comprising four signal generating circuits, that is, a rectilinear correction signal generating circuit on the lower temperature side, a rectilinear correction signal generating circuit on the higher temperature side, a gradient correction signal generating circuit, and an f-zero adjustment signal generating circuit.

Otherwise, in the case of the specification of a cellular phone requiring a function for adapting the oscillation frequency to the standard frequency of the base station by means of an external frequency control signal, the temperature-compensated crystal oscillator should adopt a configuration comprising five signal generating circuits, that is, the rectilinear correction signal generating circuit on the lower temperature side, the rectilinear correction signal generating circuit on the higher temperature side, the gradient correction signal generating circuit, the f-zero adjustment signal generating circuit and the external frequency control proportion signal generating circuit.

There is no constraint in particular on how to portion out the functions of the four or five signal generating circuits among the first control signal generating circuit 13, the second control signal generating circuit 14, and the third control signal generating circuit 15, except that the functions portioned out must not overlap. This is because all the signals, no matter how portioned out, are eventually synthesized so long as no overlapping occurs.

Hence, the tenth embodiment shown in FIG. 14 has an advantage over the eighth embodiment and ninth embodiment shown in FIGS. 12 and 13, respectively, in that the number of signal synthesis circuits in the stage of generating the control signals can be reduced by one because there is one additional control signal generating circuit available, although all the embodiments mentioned above will have the same result that the signals are eventually synthesized into one signal.

Figure 15:
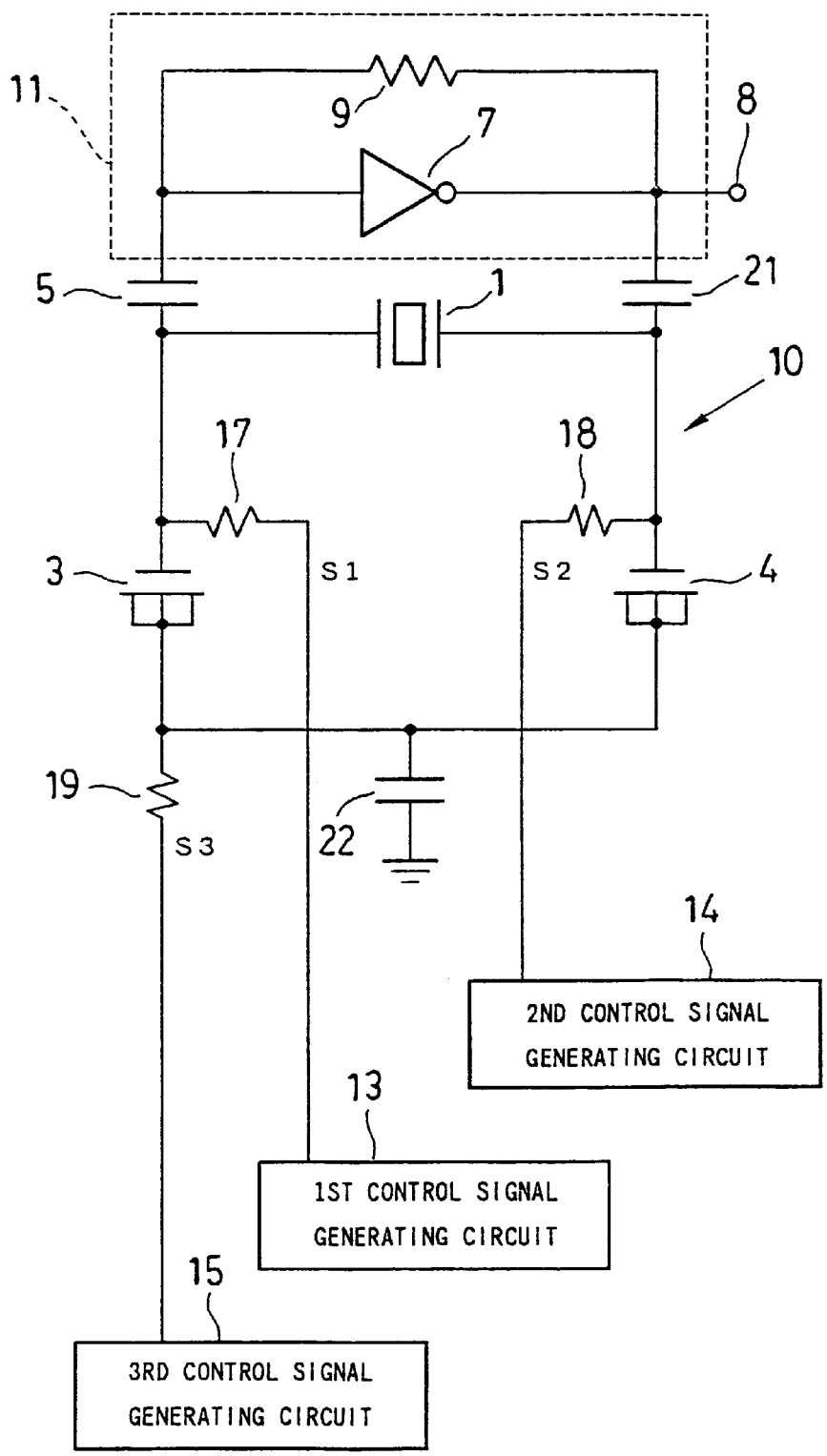
Figure 16:
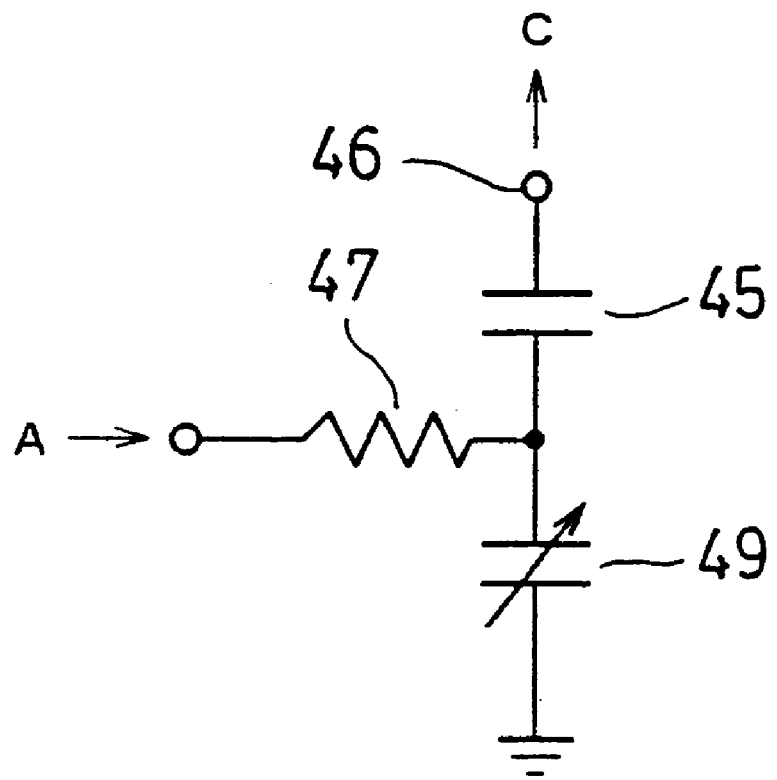
FIG. 16 is a circuit diagram showing an example of a variable capacitance circuit employed in the conventional temperature-compensated crystal oscillator

FIG. 15 is a block circuit diagram showing the configuration of an eleventh embodiment of a temperature-compensated crystal oscillator according to the invention.

The temperature-compensated crystal oscillator according to the eleventh embodiment comprises a crystal oscillation circuit 10 of the same configuration as that for the ninth embodiment shown in FIG. 13, and respective output terminals of first, second, and third control signal generating circuits 13, 14, and 15, are connected directly, or via input resistors 17, 18, and 19, respectively, thereto as in the case of the tenth embodiment shown in FIG. 14 so that respective control signals S1, S2, and S3 can be impressed on MOS capacitors 3, and 4.

With the temperature-compensated crystal oscillator according to the eleventh embodiment as well, the same effect of operation as that for the tenth embodiment previously described can be obtained.

Supplement

As described in the foregoing, all the embodiments of the invention are configured such that the control signals are impressed on the terminals on the opposite ends of the MOS capacitor.

Accordingly, the MOS capacitor employed in carrying out the invention must be constructed such that not only the gate electrode but also the opposite electrode is electrically isolated from the surrounding.

The well known art of electrically isolating the opposite electrode of a MOS capacitor is by means of a pn junction. However, this means has several vital drawbacks, such as frequency drift occurring after voltage is impressed, besides a problem of stray capacitance resulting from the pn junction, and therefore, it is not applicable to the invention.

Consequently, the opposite electrode of the MOS capacitor employed in the invention is fabricated in such a way as to be separated from the surrounding for insulation.

The easiest means for insulation by separation is to separate the semiconductor substrate on which the control signal generating circuits and so forth are formed from the semiconductor substrate for forming the MOS capacitors.

Such separation of the semiconductor substrates is advantageous in that type and thickness of the gate insulation film of the MOS capacitor can be set freely irrespective of the control signal generating circuits and so forth, thereby making it easier to fabricate a MOS capacitor having a large physical capacitance variation ratio.

Means for insulation by separation, called silicon on insulator, may also be adopted. However, in this case, the activated layer needs to have a certain minimum thickness because if the activated layer is too thin, causing the depletion layer to reach beneath the activated layer, the capacitance value undergoes sharp changes.

As the power source voltage of the temperature-compensated crystal oscillator is normally 3 V or lower, an activated layer not less than 100 nm in thickness may be sufficient.

While various embodiments of the invention have been described, it is to be understood that the invention is not limited thereto and that various changes and modifications may be made in the invention without departing from the spirit and scope thereof.

For example, in the foregoing described embodiments, the MOS capacitor comprising an n-type semiconductor substrate and an n-type gate electrode is described by way of example, but a MOS capacitor comprising a p-type semiconductor substrate and a p-type gate electrode may be used instead. Furthermore, the semiconductor substrate may be of a semiconductor type opposite to that of the gate electrode.

In the embodiments shown in FIGS. 5, 7, 10, 11, 12, 13, 14, and 15, respectively, the second fixed capacitor 21 or the third fixed capacitor 22 is connected to the ground, but it may be connected to, for example, the power source (Vcc) on the higher potential side since such connection can be made at an optional DC level.

Further, in the embodiments shown in FIGS. 12 to 15, respectively, the opposite electrode of the first MOS capacitor 3 is connected with the same of the second MOS capacitor 4. However, if separate semiconductor substrates are in use by adopting means of using different chips, the gate electrode of the second MOS capacitor 4 may be connected with the opposite electrode of the first MOS capacitor 3.

As described hereinbefore, the invention can provide a temperature-compensated crystal oscillator capable of expanding the range of temperature compensation, and eliminating mutual interference between temperature compensation and external frequency control at low cost through adoption of a configuration wherein the control signals can be impressed on the opposite terminals of the MOS capacitor.

Hence, the invention can exhibit significant merits particularly when applied to temperature-compensated crystal oscillators for use in cellular phones which are required to meet the CDMA specification.

What is claimed is:

1. A temperature-compensated crystal oscillator, comprising:
   a crystal oscillation circuit provided with an AT-cut crystal resonator and an MOS capacitor for providing a variable capacitance for adjustment of an oscillation frequency;
   a first control signal generating circuit for temperature compensation, connected directly or via a first input resistor to one terminal of the MOS capacitor; and
   a second control signal generating circuit for temperature compensation, connected directly or via a second input resistor to another terminal of the MOS capacitor,
   wherein the crystal oscillation circuit further comprises:
      a series connection of the AT-cut crystal resonator, the MOS capacitor, and a first fixed capacitor, in that order;
      an amplifier connected in parallel with series connection; and
      a second fixed capacitor coupled in parallel with the amplifier.

2. A temperature-compensated crystal oscillator, comprising:
   a crystal oscillation circuit provided with an AT-cut crystal resonator and an MOS capacitor for providing a variable capacitance for adjustment of an oscillation frequency;
   a first control signal generating circuit for temperature compensation, connected directly or via a first input resistor to one terminal of the MOS capacitor; and
   a second control signal generating circuit for temperature compensation, connected directly or via a second input resistor to another terminal of the MOS capacitor,
   wherein the crystal oscillation circuit further comprises:
      a series connection of the AT-cut crystal resonator, the MOS capacitor, and a fixed capacitor, in that order;
      an amplifier connected in parallel with the series connection; and
      a second fixed capacitor and a third fixed capacitor extending between a constant potential source and an input terminal of the amplifier, and an output terminal of the amplifier, respectively.

3. A temperature-compensated crystal oscillator, comprising:
   a crystal oscillation circuit provided with an AT-cut crystal resonator and an MOS capacitor for providing a variable capacitance for adjustment of an oscillation frequency;
   a first control signal generating circuit for temperature compensation, connected directly or via a first input resistor to one terminal of the MOS capacitor; and
   a second control signal generating circuit for temperature compensation, connected directly or via a second input resistor to another terminal of the MOS capacitor,
   wherein the crystal oscillation circuit further comprises:
      a series connection of the AT-cut crystal resonator, the MOS capacitor, and a first fixed capacitor;
      an amplifier connected in parallel with the series connection; and
      a second fixed capacitor coupled in parallel with the series connection of the AT-cut crystal resonator and the MOS capacitor.

4. A temperature-compensated crystal oscillator, comprising:
   a crystal oscillation circuit provided with an AT-cut crystal resonator and an MOS capacitor for providing a variable capacitance for adjustment of an oscillation frequency;
   a first control signal generating circuit for temperature compensation, connected directly or via a first input resistor to one terminal of the MOS capacitor; and
   a second control signal generating circuit for temperature compensation, connected directly or via a second input resistor to another terminal of the MOS capacitor,
   wherein the crystal oscillation circuit further comprises:
      a series connection of the AT-cut crystal resonator, the MOS capacitor, and a first fixed capacitor;
      an amplifier connected in parallel with the series connection;
      a second fixed capacitor extending between constant potential source and a node between the amplifier and the AT-cut crystal resonator; and
      a third fixed capacitor extending between the constant potential source and a node between the MOS capacitor and the first fixed capacitor.

5. A temperature-compensated crystal oscillator, comprising:
   a crystal oscillation circuit provided with an AT-cut crystal resonator and an MOS capacitor for providing a variable capacitance for adjustment of an oscillation frequency;
   a first control signal generating circuit for temperature compensation, connected directly or via a first input resistor to one terminal of the MOS capacitor; and
   a second control signal generating circuit for temperature compensation, connected directly or via a second input resistor to another terminal of the MOS capacitor,
   wherein the crystal oscillation circuit further comprises:
      a series connection of a first fixed capacitor, the MOS capacitor, and a second fixed capacitor;
      an amplifier connected in parallel with the series connection; and
      the AT-cut crystal resonator connected in parallel with the amplifier.

6. A temperature-compensated crystal oscillator, comprising:
- a crystal oscillation circuit provided with an AT-cut crystal resonator and an MOS capacitor for providing a variable capacitance for adjustment of an oscillation frequency;
- a first control signal generating circuit for temperature compensation, connected directly or via a first input resistor to one terminal of the MOS capacitor; and
- a second control signal generating circuit for temperature compensation, connected directly or via a second input resistor to another terminal of the MOS capacitor,
- wherein the crystal oscillation circuit further comprises:
  - a series connection of a first fixed capacitor, the MOS capacitor, and a second fixed capacitor;
  - an amplifier connected in parallel with the series connection; and
  - the AT-cut crystal resonator coupled in parallel with the MOS capacitor.

7. A temperature-compensated crystal oscillator, comprising:
- a crystal oscillation circuit provided with an AT-cut crystal resonator and an MOS capacitor for providing a variable capacitance for adjustment of an oscillation frequency;
- a first control signal generating circuit for temperature compensation connected directly or via a first input resistor to one terminal of the MOS capacitor; and
- a second control signal generating circuit for temperature compensation, connected directly or via a second input resistor to another terminal of the MOS capacitor,
- wherein the crystal oscillation circuit further comprises:
  - a parallel connection of the AT-cut crystal resonator and an amplifier; and
  - a series connection of a first fixed capacitor, the MOS capacitor, and a second fixed capacitor;
  - wherein the series connection extends between one terminal of the AT-cut crystal resonator and a constant potential source.

8. A temperature-compensated crystal oscillator comprising:
- a parallel connection of an AT-cut crystal resonator and an amplifier,
- a series connection of a first fixed capacitor, a first MOS capacitor, a second MOS capacitor, and a second fixed capacitor, coupled in parallel with the AT-cut crystal resonator;
- a third fixed capacitor extending between a constant potential source and a node between the first MOS capacitor and the second MOS capacitor;
- a first control signal generating circuit for temperature compensation, connected directly or via a first input resistor to a node between the first fixed capacitor and the first MOS capacitor;
- a second input resistor extending between the first control signal generating circuit and a node between the second fixed capacitor and the second MOS capacitor; and
- a second control signal generating circuit for temperature compensation, connected directly or via a third input resistor to a node between the first MOS capacitor and the second MOS capacitor.

9. A temperature-compensated crystal oscillator comprising:
- a series connection of a first fixed capacitor, an AT-cut crystal resonator and a second fixed capacitor;
- an amplifier connected in parallel with the series connection;
- a series connection of a first MOS capacitor and a second MOS capacitor, connected in parallel with the AT-cut crystal resonator;
- a third fixed capacitor extending between a constant potential source and a node between the first MOS capacitor and the second MOS capacitor;
- a first control signal generating circuit for temperature compensation, connected directly or via a first input resistor to a node between the first fixed capacitor and the first MOS capacitor;
- a second input resistor extending between the first control signal generating circuit and a node between the second fixed capacitor and the second MOS capacitor; and
- a second control signal generating circuit for temperature compensation, connected directly or via a third input resistor to a node between the first MOS capacitor and the second MOS capacitor.

10. A temperature-compensated crystal oscillator comprising:
- a parallel connection of an AT-cut crystal resonator and an amplifier;
- a series connection of a first fixed capacitor, a first MOS capacitor, a second MOS capacitor, and a second fixed capacitor, coupled in parallel with the AT-cut crystal resonator;
- a third fixed capacitor extending between a constant potential source and a node between the first MOS capacitor and the second MOS capacitor;
- a first control signal generating circuit for temperature compensation, connected directly or via a first input resistor to a node between the first fixed capacitor and the first MOS capacitor;
- a second control signal generating circuit for temperature compensation, connected directly or via a second input resistor to a node between the second fixed capacitor and the second MOS capacitor; and
- a third control signal generating circuit for temperature compensation, connected directly or via a third input resistor to a node between the first MOS capacitor and the second MOS capacitor.

11. A temperature-compensated crystal oscillator comprising:
- a series connection of a first fixed capacitor, an AT-cut crystal resonator and a second fixed capacitor;
- an amplifier connected in parallel with the series connection;
- a series connection of a first MOS capacitor and a second MOS capacitor, connected in parallel with the AT-cut crystal resonator,
- a third fixed capacitor extending between a constant potential source and a node between the first MOS capacitor and the second MOS capacitor;
- a first control signal generating circuit for temperature compensation, connected directly or via a first input resistor to a node between the first fixed capacitor and the first MOS capacitor;
- a second control signal generating circuit for temperature compensation, connected directly or via a second input resistor to a node between the second fixed capacitor and the second MOS capacitor; and
- a third control signal generating circuit for temperature compensation, connected directly or via a third input resistor to a node between the first MOS capacitor and the second MOS capacitor.

12. The temperature-compensated crystal oscillator according to claim 1, wherein the first control signal generating circuit serves as a rectilinear correction signal generating circuit on a lower temperature side for generating a signal for linearly correcting a temperature characteristic curve of the AT-cut crystal resonator on the lower temperature side, and the second control signal generating circuit serves as a rectilinear correction signal generating circuit on a higher temperature side for generating a signal for linearly correcting a temperature characteristic curve of the AT-cut crystal resonator on the higher temperature side.

13. The temperature-compensated crystal oscillator according to claim 8, wherein the first control signal generating circuit serves as a rectilinear correction signal generating circuit on the lower temperature side for generating a signal for linearly correcting a temperature characteristic curve of the AT-cut crystal resonator on a lower temperature side, and the second control signal generating circuit serves as a rectilinear correction signal generating circuit on a higher temperature side for generating a signal for linearly correcting a temperature characteristic curve of the AT-cut crystal resonator on the higher temperature side.

14. The temperature-compensated crystal oscillator according to claim 9, wherein the first control signal generating circuit serves as a rectilinear correction signal generating circuit on a lower temperature side for generating a signal for linearly correcting a temperature characteristic curve of the AT-cut crystal resonator on the lower temperature side, and the second control signal generating circuit serves as a rectilinear correction signal generating circuit on a higher temperature side for generating a signal for linearly correcting a temperature characteristic curve of the AT-cut crystal resonator on the higher temperature side.

15. The temperature-compensated crystal oscillator according to claim 10, wherein the rectilinear correction signal generating circuit on the lower temperature side comprises a temperature sensor with an output having a substantially linear temperature characteristic, and a square-law converter circuit on the lower temperature side for converting the output of the temperature sensor into a square-law curve signal on the lower temperature side, and the rectilinear correction signal generating circuit on the higher temperature side comprises a temperature sensor with an output having a substantially linear temperature characteristic, and a square-law converter circuit on the higher temperature side for converting the output of the temperature sensor into a square-law curve signal on the higher temperature side.

16. The temperature-compensated crystal oscillator according to claim 12, wherein the rectilinear correction signal generating circuit on the lower temperature side comprises a temperature sensor with an output having a substantially linear temperature characteristic, and a square-law converter circuit on the lower temperature side for converting the output of the temperature sensor into a square-law curve signal on the lower temperature side, and the rectilinear correction signal generating circuit on the higher temperature side comprises a temperature sensor with an output having a substantially linear temperature characteristic, and a square-law converter circuit on the higher temperature side for converting the output of the temperature sensor into a square-law curve signal on the higher temperature side.

17. The temperature-compensated crystal oscillator according to claim 13, wherein the rectilinear correction signal generating circuit on the lower temperature side comprises a temperature sensor with an output having a substantially linear temperature characteristic, and a square-law converter circuit on the lower temperature side for converting the output of the temperature sensor into a square-law curve signal on the lower temperature side, and the rectilinear correction signal generating circuit on the higher temperature side comprises a temperature sensor with an output having a substantially linear temperature characteristic, and a square-law converter circuit on the higher temperature side for converting the output of the temperature sensor into a square-law curve signal on the higher temperature side.

18. The temperature-compensated crystal oscillator according to claim 14, wherein the rectilinear correction signal generating circuit on the lower temperature side comprises a temperature sensor with an output having a substantially linear temperature characteristic, and a square-law converter circuit on the lower temperature side for converting the output of the temperature sensor into a square-law curve signal on the lower temperature side, and the rectilinear correction signal generating circuit on the higher temperature side comprises a temperature sensor with an output having a substantially linear temperature characteristic, and a square-law converter circuit on the higher temperature side for converting the output of the temperature sensor into a square-law curve signal on the higher temperature side.

* * * * *